United States Patent
Park et al.

(10) Patent No.: US 9,899,453 B2
(45) Date of Patent: Feb. 20, 2018

(54) PIXEL OF A MULTI-STACKED CMOS IMAGE SENSOR AND METHOD OF MANUFACTURING THE SAME

(71) Applicant: Samsung Electronics Co., Ltd., Suwon-si (KR)

(72) Inventors: Kyung-bae Park, Seoul (KR); Kyu-sik Kim, Jeonju-si (KR); Yong-wan Jin, Seoul (KR); Woong Choi, Seongnam-si (KR); Kwang-hee Lee, Suwon-si (KR); Do-hwan Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/012,604

(22) Filed: Feb. 1, 2016

(65) Prior Publication Data

US 2016/0225827 A1    Aug. 4, 2016

Related U.S. Application Data

(62) Division of application No. 13/205,127, filed on Aug. 8, 2011, now Pat. No. 9,252,178.

(30) Foreign Application Priority Data

Feb. 1, 2011   (KR) .................. 10-2011-0010299

(51) Int. Cl.
   *H01L 27/146*   (2006.01)
   *H01L 27/30*    (2006.01)
   (Continued)

(52) U.S. Cl.
   CPC ...... *H01L 27/307* (2013.01); *H01L 27/14632* (2013.01); *H01L 27/14636* (2013.01);
   (Continued)

(58) Field of Classification Search
   CPC ......... H01L 27/14636; H01L 27/14647; H01L 27/14652; H01L 27/14667; H01L 27/307;
   (Continued)

(56) References Cited

U.S. PATENT DOCUMENTS

| 4,737,833 A | 4/1988 | Tabei |
| 6,930,336 B1 | 8/2005 | Merrill |

(Continued)

FOREIGN PATENT DOCUMENTS

| JP | 2000-122072 A | 4/2000 |
| JP | 2005-268476 A | 9/2005 |

(Continued)

OTHER PUBLICATIONS

O. Skorka, et al., "Design and Fabrication of Vertically-Integrated CMOS Image Sensors," Open Access: Sensors, vol. 11, Apr. 2011, pp. 4512-4538.

(Continued)

*Primary Examiner* — Yu Chen
(74) *Attorney, Agent, or Firm* — NSIP Law (57) ABSTRACT

Provided is a pixel of a multi-stacked complementary metal-oxide semiconductor (CMOS) image sensor and a method of manufacturing the image sensor including a light-receiving unit that may include first through third photodiode layers that are sequentially stacked, an integrated circuit (IC) that is formed below the light-receiving unit, electrode layers that are formed on and below each of the first through third photodiode layers, and a contact plug that connects the electrode layer formed below each of the first through third photodiode layers with a transistor of the IC.

20 Claims, 6 Drawing Sheets

(51) Int. Cl.
*H01L 27/12* (2006.01)
*H01L 23/58* (2006.01)
*H01L 33/08* (2010.01)

(52) U.S. Cl.
CPC .. *H01L 27/14647* (2013.01); *H01L 27/14667* (2013.01); *H01L 27/14685* (2013.01); *H01L 27/14687* (2013.01); *H01L 23/585* (2013.01); *H01L 27/1214* (2013.01); *H01L 27/14609* (2013.01); *H01L 33/08* (2013.01); *H01L 2924/0002* (2013.01)

(58) Field of Classification Search
CPC ............. H01L 21/76897; H01L 23/481; H01L 23/5226
See application file for complete search history.

(56) References Cited

U.S. PATENT DOCUMENTS

| | | |
|---|---|---|
| 7,268,369 B2 | 9/2007 | Araki |
| 7,348,202 B2 | 3/2008 | Lee |
| 7,400,023 B2 | 7/2008 | Watanabe et al. |
| 7,495,206 B2 | 2/2009 | Park |
| 7,515,187 B2 | 4/2009 | Suzuki |
| 7,550,813 B2 | 6/2009 | Suzuki |
| 7,586,528 B2 | 9/2009 | Fukunaga et al. |
| 7,619,267 B2 | 11/2009 | Araki |
| 7,642,711 B2 | 1/2010 | Araki |
| 7,741,689 B2 | 6/2010 | Miyashita et al. |
| 7,755,158 B2 | 7/2010 | Lee |
| 7,883,916 B2 | 2/2011 | Gambino et al. |
| 7,893,468 B2 | 2/2011 | Gambino et al. |
| 2006/0181629 A1* | 8/2006 | Miyashita ......... H01L 27/14623 348/311 |
| 2006/0186408 A1 | 8/2006 | Misawa |
| 2007/0120045 A1 | 5/2007 | Yokoyama |
| 2008/0067621 A1 | 3/2008 | Chang et al. |
| 2009/0209060 A1 | 8/2009 | Suzuki |
| 2011/0139969 A1 | 6/2011 | Nii |
| 2011/0233620 A1 | 9/2011 | Naruse et al. |

FOREIGN PATENT DOCUMENTS

| | | |
|---|---|---|
| JP | 2005-340571 A | 12/2005 |
| JP | 2005-353626 A | 12/2005 |
| JP | 2007-201269 A | 8/2007 |
| KR | 10-2008-0078586 A | 8/2008 |

OTHER PUBLICATIONS

L. El Chaar, et al., "Review of photovoltaic technologies," Renewable and Sustainable Energy Reviews, vol. 15, Jun. 2011, pp. 2165-2175.

Korean Office Action dated May 12, 2017, in counterpart Korean Application No. 10-2011-0010299 (5 pages in English, 7 pages in Korean).

Korean Office Action dated Nov. 29, 2017, in corresponding Korean Application No. 10-2011-0010299 (7 pages in English, 7 pages in English).

* cited by examiner

PIXEL OF A MULTI-STACKED CMOS IMAGE SENSOR AND METHOD OF MANUFACTURING THE SAME

CROSS-REFERENCE TO RELATED APPLICATION(S)

This Application is a Divisional of U.S. patent application Ser. No. 13/205,127 filed on Aug. 8, 2011, which claims the benefit of Korean Patent Application No. 10-2011-0010299, filed on Feb. 1, 2011, in the Korean Intellectual Property Office, the entire disclosures of which are incorporated herein by reference for all purposes.

BACKGROUND

1. Field

The following description relates to an image sensor, and more particularly, to a pixel of a multi-stacked complementary metal-oxide semiconductor (CMOS) image sensor and a method for manufacturing the same.

2. Description of the Related Art

As a resolution of a complementary metal-oxide semiconductor (CMOS) image sensor of a silicon photodiode is increased, a pixel size of an image sensor is reduced.

As a pixel size of an image sensor is reduced, a light-receiving area of a photodiode in the pixel is decreased. As a result, a sensitivity of the image sensor may deteriorate. Also, if the pixel size is reduced and a thickness of the pixel remains the same size, an aspect ratio of the pixel may increase, crosstalk between adjacent pixels may increase, and a signal-to-noise ratio (SNR) may decrease. Accordingly, an image quality of the image sensor may deteriorate.

The aforementioned problems may be improved by stacking red (R), green (G), and blue (B) layers in the pixel and dividing a photodiode of each of the R, G, and B layers by an oxide layer.

After the pixel having a multi-stacked structure is formed, a via hole should be formed to send a signal of each of the R, G, and B layers to a CMOS readout integrated circuit (ROIC). However, this operation may be difficult and may cause complexity in the process.

Typically, the via hole in a pixel structure is formed by etching a plurality of material layers. The plurality of layers typically include an organic semiconductor layer, an insulating layer, a transparent electrode layer, and the like. The etching may be performed on each of the plurality of material layers via a wet etching process or via a photolithography process using a photoresist.

When the etching is performed on each of the plurality of material layers via the etching process, an organic layer in the pixel may be damaged due to a solution that is used during the etching.

Also, when the via hole is formed in the plurality of material layers via the etching process, a conductive material that fills the via hole may contact an electrode of each of the plurality of material layers in the pixel such that a short may occur. Thus, an image sensor manufacturing process may be further complicated by adding a process of depositing an insulating layer in the via hole in order to prevent the short.

SUMMARY

In one aspect of the present invention, there is provided a pixel of a multi-stacked complementary metal-oxide semiconductor (CMOS) image sensor, the pixel including a light-receiving unit including first through third photodiode layers that are sequentially stacked; an integrated circuit (IC) that is formed below the light-receiving unit; electrode layers that are formed on and below each of the first through third photodiode layers; and a contact plug that connects the electrode layer formed below each of the first through third photodiode layers with a transistor of the IC, wherein the contact plug is separate from the light-receiving unit.

The electrode layer that is formed below each of the first through third photodiode layers may extend from the light-receiving unit.

The contact plug may be formed between the transistor and a portion of the electrode layer formed below each of the first through third photodiode layers, wherein the portion that extends from the light-receiving unit, and the contact plug may be surrounded by an insulating layer.

A portion of the electrode layer that is formed below each of the first through third photodiode layers may include first and second parts that are separate from each other, wherein the portion extends from the light-receiving unit.

Each of the first through third photodiode layers may include at least one of an organic semiconductor layer, a crystal silicon layer, an amorphous silicon layer, a CIGS layer, and a quantum dot layer.

In another aspect of the present invention, there is provided a method of manufacturing a pixel of a multi-stacked complementary metal-oxide semiconductor (CMOS) image sensor, the method including forming a lower insulating layer on an integrated circuit (IC); forming a first contact hole in the lower insulating layer to expose a first transistor of the IC; forming a first lower electrode layer on the lower insulating layer to fill the first contact hole; sequentially stacking a first organic semiconductor layer and a first upper electrode layer on the first lower electrode layer to be separate from the first contact hole; forming a first interlayer insulating layer to cover the first lower electrode layer, the first organic semiconductor layer, and the first upper electrode layer; forming a second contact hole penetrating through the first interlayer insulating layer and the lower insulating layer, and exposing a second transistor of the IC; forming a second lower electrode layer on the first interlayer insulating layer to fill the second contact hole; sequentially stacking a second organic semiconductor layer and a second upper electrode layer on the second lower electrode layer to be separate from the second contact hole; forming a second interlayer insulating layer to cover the second lower electrode layer, the second organic semiconductor layer, and the second upper electrode layer; forming a third contact hole penetrating through the second interlayer insulating layer, the first interlayer insulating layer, and the lower insulating layer, and exposing a third transistor of the IC; forming a third lower electrode layer on the second interlayer insulating layer to fill the third contact hole; sequentially stacking a third organic semiconductor layer and a third upper electrode layer on the third lower electrode layer to be separate from the third contact hole; and forming an upper insulating layer to cover the third lower electrode layer, the third organic semiconductor layer, and the third upper electrode layer.

The forming the first lower electrode layer may include forming a first contact plug that fills the first contact hole; and forming the first lower electrode layer on the lower insulating layer to contact the first contact plug.

The forming the second lower electrode layer may include forming a second contact plug that fills the second contact hole; and forming the second lower electrode layer on the first interlayer insulating layer to contact the second contact plug.

The forming the third lower electrode layer may include forming a third contact plug that fills the third contact hole; and forming the third lower electrode layer on the second interlayer insulating layer to contact the third contact plug.

The forming the first contact hole may further include forming another contact hole to expose a portion of the IC in a region of the lower insulating layer that is separate from the first contact hole.

The forming the second contact hole may further include forming another contact hole to expose a portion of the IC in a region of the first interlayer insulating layer that is separate from the second contact hole.

The forming the third contact hole may further include forming another contact hole to expose a portion of the IC in a region of the second interlayer insulating layer that is separate from the third contact hole.

The forming the first lower electrode layer may include filling the other contact hole formed in the operation of forming the first contact hole with the first lower electrode layer.

The forming the second lower electrode layer may include filling the other contact hole formed in the operation of forming the second contact hole with the second lower electrode layer.

The forming the third lower electrode layer may include filling the other contact hole formed in the operation of forming the third contact hole with the third lower electrode layer.

Each of the first through third photodiode layers may comprise at least one of an organic semiconductor layer, a crystal silicon layer, an amorphous silicon layer, a CIGS layer, and a quantum dot layer.

In another aspect of the present invention, there is provided a pixel of a complementary metal-oxide semiconductor (CMOS) image sensor, the pixel including a plurality of pixel units comprising at least a first pixel unit, a second pixel unit, and a third pixel unit, an integrated circuit (IC) configured to control the plurality of pixel units, and a plurality of plugs comprising a first plug that electrically connects the first pixel unit to the IC, a second plug that electrically connects the second pixel unit to the IC, and a third plug that electrically connects the third pixel unit to the IC.

The plugs may each be of different heights.

The first plug may be shorter in height than the second plug and the second plug may be shorter in height than the third plug.

Each pixel unit may comprise an upper electrode layer and a lower electrode layer, and may further comprise an organic semiconductor layer between the upper electrode layer and the lower electrode layer.

The lower electrode layer of each pixel unit may further comprise an extended edge that extends out farther than the lower organic semiconductor layer and the upper electrode layer, and that electrically connects to the respective plug.

The first plug, the second plug, and the third plug may be formed in parallel to each other on a side of the pixel.

The first pixel unit may be included in a first layer of the pixel, the second pixel unit may be included in a second layer of the pixel, and the third pixel unit may be included in a third layer of the pixel, The IC may be below the first layer, the first layer may be below the second layer, and the second layer may be below the third layer.

The first plug may extend from the IC through a portion of the first layer, the second plug may extend from the IC through the first layer and through a portion of the second layer, and the third plug may extend from the IC through the first and second layers and through a portion of the third layer.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
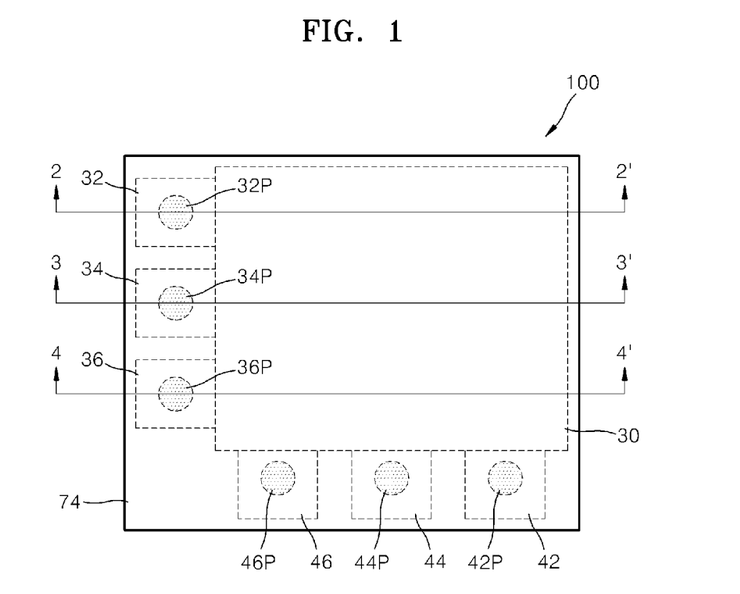
FIG. 1 is a diagram illustrating an example of a pixel of a multi-stacked complementary metal-oxide semiconductor (CMOS) image sensor, according to an embodiment of the present invention.

FIG. 1 illustrates an example of a pixel of a multi-stacked complementary metal-oxide semiconductor (CMOS) image sensor, according to an embodiment of the present invention. For example, the image sensor may be included in various imaging devices, such as a camera, a mobile terminal such as a smart phone, a tablet, a video recorder, and the like.

Referring to FIG. 1, pixel 100 includes a light-receiving unit 30 for receiving light incident from an external source. The light-receiving unit 30 is covered by an upper insulating layer 74. The pixel 100 includes first through third extension electrode units 32, 34, and 36. The first through third extension electrode units 32, 34, and 36 are connected to the light-receiving unit 30, and protrude from the light-receiving unit 30. The first through third extension electrode units 32, 34, and 36 may be arranged at a side of the light-receiving unit 30.

For example, the first through third extension electrode units 32, 34, and 36 may be vertically arranged at a side of the light-receiving unit 30 such as one of the vertical sides of the light-receiving unit 30. As another example, the first through third extension electrode units 32, 34, and 36 may be arranged at any side of the light-receiving unit 30. The first through third extension electrode units 32, 34, and 36 include first through third contact plugs 32P, 34P, and 36P, respectively. In this example, the first through third extension electrode units 32, 34, and 36 and the first through third contact plugs 32P, 34P, and 36P are covered by the upper insulating layer 74.

The pixel 100 includes fourth through sixth extension electrode units 42, 44, and 46. The fourth through sixth extension electrode units 42, 44, and 46 are connected to the light-receiving unit 30, and protrude from the light-receiving unit 30. The fourth through sixth extension electrode units 42, 44, and 46 may be positioned at a location that is different from the location of the first through third extension electrode units 32, 34, and 36. The fourth through sixth extension electrode units 42, 44, and 46 may be connected to a common electrode terminal of a light-receiving device including the pixel 100. The fourth through sixth extension electrode units 42, 44, and 46 include fourth through sixth contact plugs 42P, 44P, and 46P, respectively, and are connected to the common electrode terminal of the light-receiving device via the fourth through sixth contact plugs 42P, 44P, and 46P.

Figure 2:
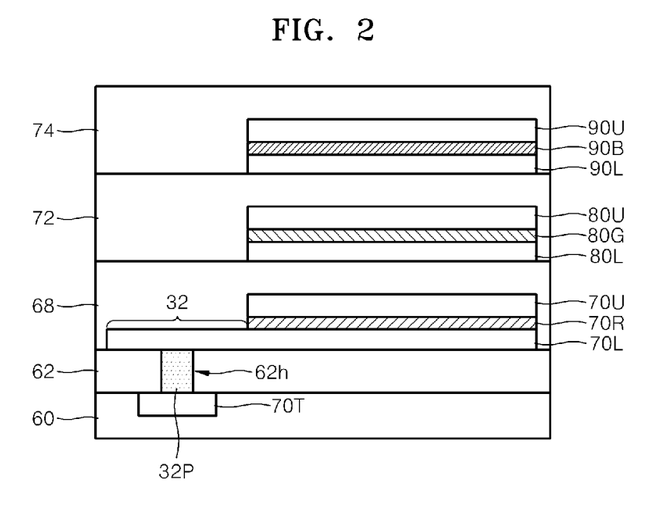
FIG. 2 is a diagram illustrating an example of the pixel taken along a 2-2' direction of FIG. 1, according to an embodiment of the present invention.

FIG. 2 illustrates an example of the pixel 100 taken along a 2-2' direction of FIG. 1, according to an embodiment of the present invention.

Referring to FIG. 2, a lower insulating layer 62 is arranged on a CMOS readout integrated circuit (ROIC) 60 (hereinafter, referred to as 'IC'). A first contact hole 62h is used to expose a first transistor 70T that is formed in the lower insulating layer 62. The first transistor 70T is included in the IC 60. For example, the first transistor 70T may be a Field-Effect Transistor (FET). The first contact hole 62h is filled with the first contact plug 32P.

A first lower electrode layer 70L is arranged on the lower insulating layer 62. The first extension electrode unit 32 that extends from the first lower electrode layer 70L covers the first contact plug 32P. The first extension electrode unit 32 may include the same material as the first contact plug 32P. A first organic semiconductor layer 70R and a first upper electrode layer 70U are sequentially stacked on the first lower electrode layer 70L. The first organic semiconductor layer 70R may be a photodiode layer. For example, the first organic semiconductor layer 70R may be a material layer that has photoelectric conversion characteristics with respect to red light. As another example, instead of using the first organic semiconductor layer 70R, another photodiode layer that has the same or similar photoelectric conversion characteristics with the first organic semiconductor layer 70R may be used. The first upper electrode layer 70U and the first organic semiconductor layer 70R are separate from the first contact hole 62h.

The first lower electrode layer 70L, the first upper electrode layer 70U, and the first organic semiconductor layer 70R form a sub-pixel unit that is included in the pixel 100, for example, they may form a sub-pixel unit that has photoelectric conversion characteristics with respect to red light. The first lower electrode layer 70L, the first upper electrode layer 70U, and the first organic semiconductor layer 70R are covered by a first interlayer insulating layer 68. A top surface of the first interlayer insulating layer 68 is planarized.

A second lower electrode layer 80L, a second organic semiconductor layer 80G, and a second upper electrode layer 80U are sequentially stacked on the first interlayer insulating layer 68. For example, the second organic semiconductor layer 80G may be a material layer that has photoelectric conversion characteristics with respect to green light. The second lower electrode layer 80L, the second organic semiconductor layer 80G, and the second upper electrode layer 80U may form a second sub-pixel unit that is included in the pixel 100, for example, they may form a sub-pixel unit that has photoelectric conversion characteristics with respect to green light. In this example, the second sub-pixel unit may be positioned above the first upper electrode layer 70U. The second lower electrode layer 80L, the second organic semiconductor layer 80G, and the second upper electrode layer 80U are covered by a second interlayer insulating layer 72. A top surface of the second interlayer insulating layer 72 is flat.

A third lower electrode layer 90L, a third organic semiconductor layer 90B, and a third upper electrode layer 90U are sequentially stacked on the second interlayer insulating layer 72. The third lower electrode layer 90L and the third upper electrode layer 90U may include a transparent electrode material. The first and second electrode material layers 70L, 70U, 80L, and 80U may also include a transparent electrode material. For example, the third organic semiconductor layer 90B may be a material layer that has photoelectric conversion characteristics with respect to blue light. A stack of the third lower electrode layer 90L, the third organic semiconductor layer 90B, and the third upper electrode layer 90U may form a third sub-pixel unit that is included in the pixel 100, for example, the stack may form a sub-pixel unit that has photoelectric conversion characteristics with respect to blue light. The third sub-pixel unit may be arranged above the second upper electrode layer 80U. The sub-pixel unit including the third lower electrode layer 90L, the third organic semiconductor layer 90B, and the third upper electrode layer 90U is covered by the upper insulating layer 74. The upper insulating layer 74 may be a light-transmitting layer.

Figure 3:
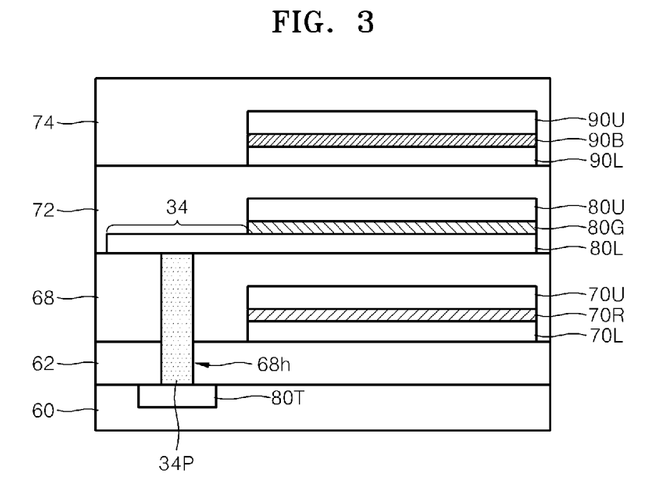
FIG. 3 is a diagram illustrating an example of the pixel taken along a 3-3' direction of FIG. 1, according to an embodiment of the present invention.

FIG. 3 illustrates an example of the pixel 100 taken along a 3-3' direction of FIG. 1, according to an embodiment of the present invention. The example of FIG. 3 illustrates a connection relation between the second lower electrode layer 80L and the IC 60.

Referring to FIG. 3, the second lower electrode layer 80L has the second extension electrode unit 34 extending from the second organic semiconductor layer 80G and the second upper electrode layer 80U which are sequentially stacked. For example, the second organic semiconductor layer 80G may be a photodiode layer. As another example, instead of using the second organic semiconductor layer 80G, another photodiode layer that has the same or similar photoelectric conversion characteristics with the second organic semiconductor layer 80G may be used. The second extension electrode unit 34 is connected to a second transistor 80T of the IC 60 via the second contact plug 34P that fills a second contact hole 68h.

The second extension electrode unit 34 and the second contact plug 34P may be of the same material. The second transistor 80T may be an FET. The second organic semiconductor layer 80G and the second upper electrode layer 80U are separate from the second contact plug 34P. The second contact hole 68h penetrates through the lower insulating layer 62 and the first interlayer insulating layer 68 which are sequentially stacked. As shown in the examples of FIGS. 2 and 3 which are cross-sectional views of the pixel 100 of FIG. 1, taken at different directions, it is possible to see that the first contact hole 62h of FIG. 2 and the second contact hole 68h of FIG. 3 are formed at different positions.

Figure 4:
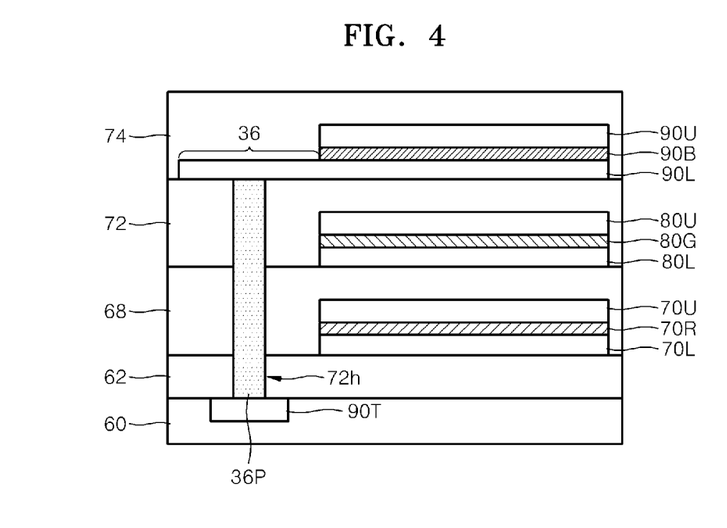
FIG. 4 is a diagram illustrating an example of the pixel taken along a 4-4' direction of FIG. 1, according to an embodiment of the present invention.

FIG. 4 illustrates an example of the pixel 100 taken along a 4-4' direction of FIG. 1, according to an embodiment of the present invention. The example of FIG. 4 illustrates a connection relation between the third lower electrode layer 90L and the IC 60.

Referring to FIG. 4, the third lower electrode layer 90L has the third extension electrode unit 36 extending from the third organic semiconductor layer 90B and the third upper electrode layer 90U which are sequentially stacked. For example, the third organic semiconductor layer 90B may be a photodiode layer that has photoelectric conversion characteristics. As another example, instead of using the third organic semiconductor layer 90B, another photodiode layer that has the same or similar photoelectric conversion characteristics with the third organic semiconductor layer 90B may be used. The third extension electrode unit 36 is connected to a third transistor 90T of the IC 60 via the third contact plug 36P filling a third contact hole 72h. For example, third extension electrode unit 36 and the third contact plug 36P may be the same material. The third transistor 90T may be an FET.

The third organic semiconductor layer 90B and the third upper electrode layer 90U are separate from the third contact plug 36P. The third contact hole 72h penetrates through the lower insulating layer 62, the first interlayer insulating layer 68, and the second interlayer insulating layer 72 which are sequentially stacked. As shown in the examples of FIGS. 2 through 4 which are cross-sectional views of the pixel 100 of FIG. 1, taken at different directions, it is possible to see that the first contact hole 62h of FIG. 2, the second contact hole 68h of FIG. 3, and the third contact hole 72h of FIG. 4 are formed at different positions and are of different heights. In the examples shown in FIGS. 2-4, the first contact hole 62h is shorter in height than the second contact hole 68h and the second contact hole 68h is shorter in height than the third contact hole 72h.

As shown in FIGS. 1 through 4, the first through third transistors 70T, 80T, and 90T and the first through third lower electrode layers 70L, 80L, and 90L included in the IC 60 are connected to each other via paths (i.e., the first through third contact plugs 32P, 34P, and 36P) that are formed outside the first through third organic semiconductor layers 70R, 80G, and 90B. Thus, it is possible to solve disadvantages of the related art. As is described in a manufacturing method, the paths (i.e., the first through third contact plugs 32P, 34P, and 36P) may be formed via one process. Thus, a CMOS image sensor manufacturing method may be further simplified.

Hereinafter, examples of a method of manufacturing a pixel of a multi-stacked CMOS image sensor are described with reference to FIGS. 5 through 10. In FIGS. 5 through 10, like reference numerals in FIGS. 1 through 4 denote like elements.

Figure 5:
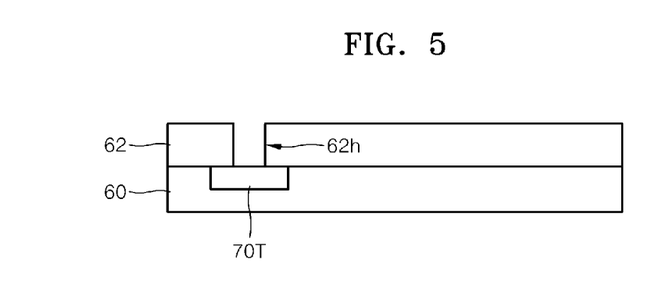
FIGS. 5 through 10 are diagrams illustrating examples of methods of manufacturing a pixel of a multi-stacked CMOS image sensor, according to an embodiment of the present invention.

Referring to FIG. 5, a lower insulating layer 62 is formed on an IC 60. For example, a material forming the lower insulating layer 62 may include at least one of silicon oxide ($SiO_2$), silicon nitride (SiN), aluminum oxide ($Al_2O_3$), titanium oxide ($TiO_2$), and germanium oxide (GeOx). A first contact hole 62h is formed in the lower insulating layer 62 to expose a portion of a first transistor 70T. The first contact hole 62h may be formed by a dry etching process or a wet etching process. The dry etching process may use plasma. The wet etching process may use hydrogen fluoride (HF)-based solution.

Figure 6:
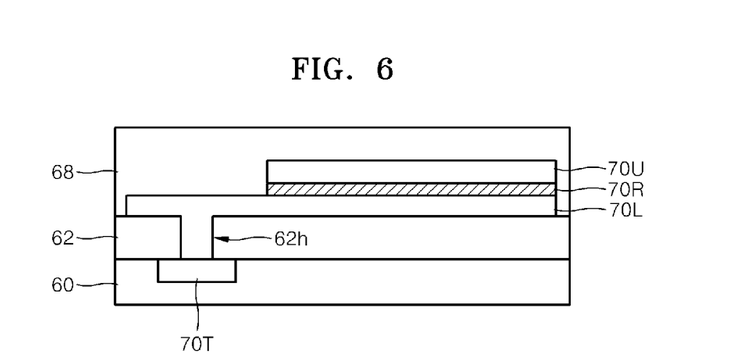

As illustrated in FIG. 6, a first lower electrode layer 70L is formed on the lower insulating layer 62 to fill the first contact hole 62h. A process of forming the first lower electrode layer 70L may be divided into two sub-processes. For example, the process may be divided into a first sub-process of forming a contact plug (refer to the contact plug 32P of FIG. 2) that fills the first contact hole 62h, and a second sub-process of forming an electrode layer contacting the contact plug. The first lower electrode layer 70L may be formed of a transparent electrode material such as indium tin oxide (ITO), indium zinc oxide (IZO), or aluminum zinc oxide (AZO).

A first organic semiconductor layer 70R and a first upper electrode layer 70U are sequentially stacked on the first lower electrode layer 70L. For example, the first organic semiconductor layer 70R may be a photodiode layer. The first organic semiconductor layer 70R and the first upper electrode layer 70U are formed at positions that are separate from the first contact hole 62h. For example, the first organic semiconductor layer 70R may be formed of a material including one or more of Cu-Phthalocyanine or Sn-Phthalocyanine. As another example, instead of using the first organic semiconductor layer 70R, one or more of a crystal silicon layer, an amorphous silicon layer, a CIGS layer, and a quantum dot layer that have the same or similar photoelectric conversion characteristics with the first organic semiconductor layer 70R may be used. For example, the quantum dot layer may include one or more of PbSe, PbS, and CdTe, as a quantum dot.

The first upper electrode layer 70U may be formed of the same material or a different transparent conductive material in comparison to the first lower electrode layer 70L. When the first contact hole 62h is formed, another contact hole (not shown) may be formed in another position of the lower insulating layer 62. Then, when the first lower electrode layer 70L is formed, the other contact hole may be filled with the first lower electrode layer 70L. By doing so, the fourth contact plug 42P (refer to FIG. 1) may be formed. The first organic semiconductor layer 70R and the first upper electrode layer 70U may be formed at positions that are separate from the other contact hole. Afterward, a first interlayer insulating layer 68 is formed to cover the first lower electrode layer 70L, the first organic semiconductor layer 70R, and the first upper electrode layer 70U. A top surface of the first interlayer insulating layer 68 is planarized. For example, the first interlayer insulating layer 68 may be formed of the same material as the lower insulating layer 62.

Figure 7:
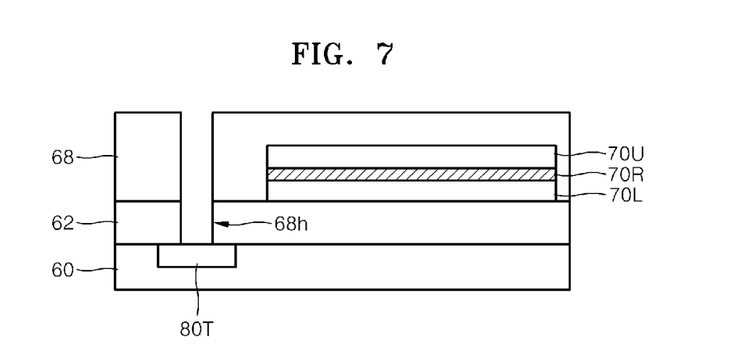
Figure 8:
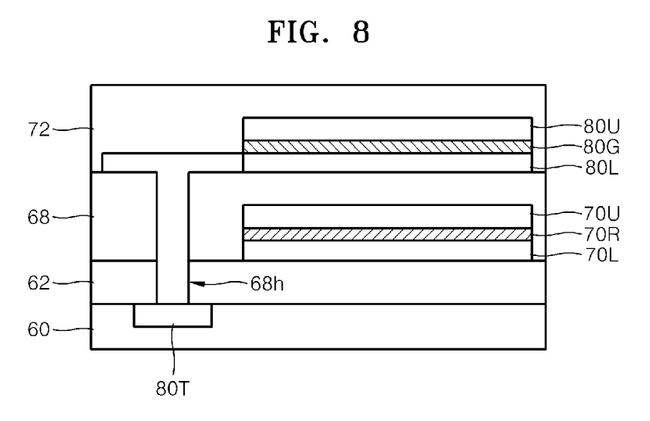

FIGS. 7 and 8 illustrate a manufacturing process with reference to a cross-sectional view taken along a 3-3' direction of FIG. 1. In the example of FIGS. 7 and 8, the first contact hole 62h, a portion filling the first contact hole 62h, and the first transistor 70T of the IC 60 of FIG. 6 are not illustrated.

Referring to FIG. 7, a second contact hole 68h is formed to sequentially penetrate through the first interlayer insulating layer 68 and the lower insulating layer 62. The second contact hole 68h is formed at a position that is separate from the first lower electrode layer 70L, the first organic semiconductor layer 70R, and the first upper electrode layer 70U. Due to the second contact hole 68h, a portion of a second transistor 80T of the IC 60 is exposed. The second transistor 80T may be separate from the first transistor 70T. When the second contact hole 68h is formed, another contact hole (not shown) may be formed in the lower insulating layer 62 and the first interlayer insulating layer 68. The other contact hole may be filled with the fifth contact plug 44P of FIG. 1.

Referring to FIG. 8, a second lower electrode layer 80L is formed on the first interlayer insulating layer 68 to fill the second contact hole 68h. Similar to the first lower electrode layer 70L of FIG. 6, a process of forming the second lower electrode layer 80L may also be divided into two sub-processes. When the second lower electrode layer 80L is formed, the other contact hole penetrating through the lower insulating layer 62 and the first interlayer insulating layer 68 may be filled with the second lower electrode layer 80L. For example, the second lower electrode layer 80L may be formed of the same or different material from the first lower electrode layer 70L.

A second organic semiconductor layer 80G and a second upper electrode layer 80U are sequentially stacked on the second lower electrode layer 80L. The second organic semiconductor layer 80G may be a photodiode layer. Examples of a material that forms the second organic semiconductor layer 80G may include at least one of quinacridone, a triphenylamine derivative, and a thiophene derivative. As another example, instead of using the second organic semiconductor layer 80G, a material layer such as a crystal silicon layer, an amorphous silicon layer, a CIGS layer, and/or a quantum dot layer that have the same or similar photoelectric conversion characteristics with the second organic semiconductor layer 80G may be used. For example, the quantum dot layer may include PbSe, PbS, or CdTe, as a quantum dot.

The second upper electrode layer 80U may be formed of the same or different material from the first upper electrode layer 70U. The second organic semiconductor layer 80G and the second upper electrode layer 80U may be formed at positions that are separate from the second contact hole 68h and the other contact hole. Afterward, a second interlayer insulating layer 72 is formed to cover the second lower electrode layer 80L, the second organic semiconductor layer 80G, and the second upper electrode layer 80U. A top surface of the second interlayer insulating layer 72 is planarized. In this example, the second interlayer insulating layer 72 may be formed of the same material as the first interlayer insulating layer 68.

Figure 9:
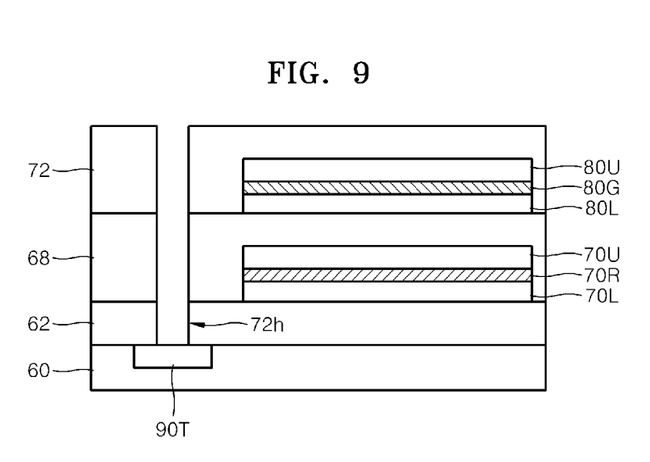
Figure 10:
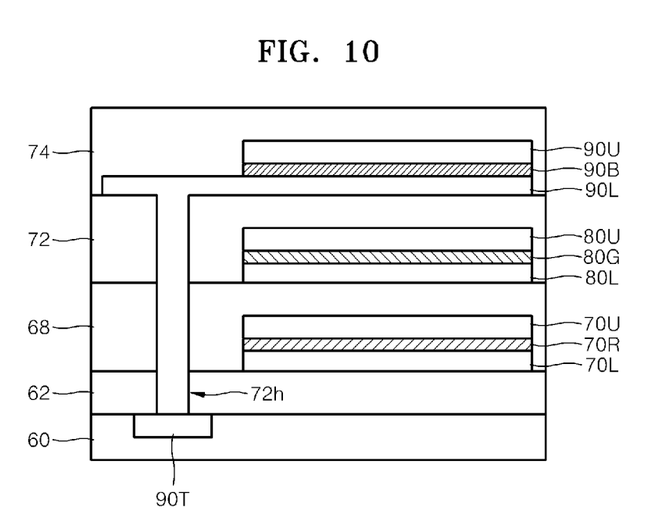

FIGS. 9 and 10 illustrate a manufacturing process with reference to a cross-sectional view taken along a 4-4' direction of FIG. 1. Thus, in FIGS. 9 and 10, the first contact hole 62h, a portion filling the first contact hole 62h, and the first transistor 70T of the IC 60 of FIG. 6, and the second contact hole 68h, a portion filling the second contact hole 68h, and the second transistor 80T of the IC 60 of FIG. 8 are not illustrated.

Referring to FIG. 9, a third contact hole 72h is formed to sequentially penetrate through the second interlayer insulating layer 72, the first interlayer insulating layer 68, and the lower insulating layer 62. The third contact hole 72h is formed at a position that is separate from the first lower electrode layer 70L, the first organic semiconductor layer 70R, the first upper electrode layer 70U, the second lower electrode layer 80L, the second organic semiconductor layer 80G, and the second upper electrode layer 80U. A portion of a third transistor 90T of the IC 60 is exposed via the third contact hole 72h. The third transistor 90T may be separate from the first and second transistors 70T and 80T. When the third contact hole 72h is formed, another contact hole (not shown) may be formed to sequentially penetrate through the lower insulating layer 62, the first interlayer insulating layer 68, and the second interlayer insulating layer 72. For example, the other contact hole may be filled with the sixth contact plug 46P of FIG. 1.

Next, referring to FIG. 10, a third lower electrode layer 90L is formed on the second interlayer insulating layer 72 to fill the third contact hole 72h. For example, the third lower electrode layer 90L may be formed of the same material or a different conductive material from the first lower electrode layer 70L. As described with reference to the first lower electrode layer 70L, a process of forming the third lower electrode layer 90L may be divided into two sub-processes. For example, the process may be divided into a first sub-process of forming a contact plug that fills the third contact hole 72h, and a second sub-process of forming an electrode layer contacting the contact plug on the second interlayer insulating layer 72. When the third lower electrode layer 90L is formed, the other contact hole formed together with the third contact hole 72h may be filled with the third lower electrode layer 90L.

A third organic semiconductor layer 90B and a third upper electrode layer 90U are sequentially stacked on the third lower electrode layer 90L. For example, the third organic semiconductor layer 90B may be a photodiode layer. Examples of a material forming the third organic semiconductor layer 90B include one or more of tetracene, coumarin, an EDOT derivative, rubrene, and the like. As another example, instead of using the third organic semiconductor layer 90B, a material layer such as a crystal silicon layer, an amorphous silicon layer, a CIGS layer, or a quantum dot layer that have the same or similar photoelectric conversion characteristics with the third organic semiconductor layer 90B may be used. For example, the quantum dot layer may include PbSe, PbS, or CdTe, as a quantum dot.

The third upper electrode layer 90U may be formed of the same or different material from the first upper electrode layer 70U. The third organic semiconductor layer 90B and the third upper electrode layer 90U may be formed at positions that are separate from the third contact hole 72h and the other contact hole. After the third upper electrode layer 90U is formed, an upper insulating layer 74 may be formed to cover the third lower electrode layer 90L, the third organic semiconductor layer 90B, and the third upper electrode layer 90U. The upper insulating layer 74 may be formed of the same material as the lower insulating layer 62 or may be formed of a different insulating material in comparison to the lower insulating layer 62.

As described herein, in the pixel of the multi-stacked CMOS image sensor, the contact plug that connects the electrode layer included in each sub-pixel unit of the light-receiving unit with the IC of the pixel may be formed by penetrating through the insulating layer around the light-receiving unit. Accordingly, in order to form the contact plug, only the insulating layer around the light-receiving unit may be etched, and thus, the manufacturing process may be simplified.

Also, when the contact plug is formed in the multi-stacked CMOS image sensor, a photoelectric conversion layer (the photodiode layer) in the light-receiving unit is not affected by the forming of the contact plug. Thus, it is possible to manufacture a CMOS image sensor that has a higher performance and higher resolution.

For example, the CMOS image sensor may be used in digital cameras, cameras for mobile phones, infrared cameras, closed-circuit televisions (CCTVs), cameras for personal computer (PC) communication, and the like.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a pixel of a multi-stacked complementary metal-oxide semiconductor (CMOS) image sensor, the method comprising:
    forming a lower insulating layer on an integrated circuit (IC);
    forming a first contact hole in the lower insulating layer to expose a first transistor of the IC;
    forming a first lower electrode layer on the lower insulating layer to fill the first contact hole;
    sequentially stacking a first photodiode layer and a first upper electrode layer on the first lower electrode layer to be separate from the first contact hole, wherein a width of the first lower electrode layer is larger than a width of the first photodiode layer and a width of the first upper electrode layer;
    forming a first interlayer insulating layer to cover the first lower electrode layer, and extend beyond the width of the first photodiode layer, and the width of the first upper electrode layer;
    forming a second contact hole penetrating through the first interlayer insulating layer and the lower insulating layer, and exposing a second transistor of the IC;
    forming a second lower electrode layer on the first interlayer insulating layer to fill the second contact hole;
    sequentially stacking a second photodiode layer and a second upper electrode layer on the second lower electrode layer to be separate from the second contact hole;
    forming a second interlayer insulating layer to cover the second lower electrode layer, the second photodiode layer, and the second upper electrode layer;
    forming a third contact hole penetrating through the second interlayer insulating layer, the first interlayer insulating layer, and the lower insulating layer, and exposing a third transistor of the IC;
    forming a third lower electrode layer on the second interlayer insulating layer to fill the third contact hole;
    sequentially stacking a third photodiode layer and a third upper electrode layer on the third lower electrode layer to be separate from the third contact hole; and
    forming an upper insulating layer to cover the third lower electrode layer, the third photodiode layer, and the third upper electrode layer.

2. The method of claim 1, wherein the forming of the first lower electrode layer comprises:
    forming a first contact plug that fills the first contact hole; and
    forming the first lower electrode layer on the lower insulating layer to contact the first contact plug.

3. The method of claim 1, wherein the forming of the second lower electrode layer comprises:
    forming a second contact plug that fills the second contact hole; and
    forming the second lower electrode layer on the first interlayer insulating layer to contact the second contact plug.

4. The method of claim 1, wherein the forming of the third lower electrode layer comprises:
    forming a third contact plug that fills the third contact hole; and
    forming the third lower electrode layer on the second interlayer insulating layer to contact the third contact plug.

5. The method of claim 1, wherein the forming of the first contact hole further comprises forming another contact hole to expose a portion of the IC in a region of the lower insulating layer that is separate from the first contact hole.

6. The method of claim 5, wherein the forming of the first lower electrode layer comprises filling the other contact hole with the first lower electrode layer.

7. The method of claim 1, wherein the forming of the second contact hole further comprises forming another contact hole to expose a portion of the IC in a region of the first interlayer insulating layer that is separate from the second contact hole.

8. The method of claim 7, wherein the forming of the second lower electrode layer comprises filling the other contact hole with the second lower electrode layer.

9. The method of claim 1, wherein the forming of the third contact hole further comprises forming another contact hole to expose a portion of the IC in a region of the second interlayer insulating layer that is separate from the third contact hole.

10. The method of claim 9, wherein the forming of the third lower electrode layer comprises filling the other contact hole with the third lower electrode layer.

11. The method of claim 1, wherein each of the first through third photodiode layers comprises at least one of an organic semiconductor layer, a crystal silicon layer, an amorphous silicon layer, a CIGS layer, and a quantum dot layer.

12. The method of claim 1, wherein the forming the first interlayer insulating layer comprises extending the first interlayer insulating layer to extend beyond a width of the first lower electrode layer, the width of the first photodiode layer, and the width of the first upper electrode layer on both sides.

13. The method of claim 1, wherein the forming the first lower electrode layer comprises extending the first lower electrode layer beyond the width of the first photodiode layer, and the width of the first upper electrode layer.

14. The method of claim 1, wherein the forming the first lower electrode layer comprises extending, on only one side, the first lower electrode layer beyond the width of the first photodiode layer, and the width of the first upper electrode layer.

15. The method of claim 1, wherein the forming the second contact hole comprises forming the second contact hole to a side of and separate from the first lower electrode layer, the first photodiode layer, and the first upper electrode layer, without the second contact hole passing through the first lower electrode layer, the first photodiode layer, and the first upper electrode layer.

16. The method of claim 1, wherein the forming the third contact hole comprises forming the third contact hole to a side of the first lower electrode layer, the first photodiode layer, the first upper electrode layer, the second lower electrode layer, the second photodiode layer, and the second upper electrode layer, without the third contact hole passing through the first lower electrode layer, the first photodiode layer, the first upper electrode layer, the second lower electrode layer, the second photodiode layer, and the second upper electrode layer.

17. The method of claim 1, wherein the forming the lower insulating layer comprises forming the lower insulating layer directly above the first transistor of the IC.

18. The method of claim 1, wherein the forming the second upper electrode layer comprises forming the second upper electrode layer using a different material from the first upper electrode layer.

19. The method of claim 1, wherein the forming the third upper electrode layer comprises forming the third upper electrode layer using a different material from the first upper electrode layer.

20. The method of claim 1, wherein the forming the upper insulating layer comprises forming the upper insulating layer using a different material from the lower insulating layer.

* * * * *